(12) United States Patent
Kim et al.

(10) Patent No.: US 11,377,738 B2
(45) Date of Patent: Jul. 5, 2022

(54) METHOD OF APPLYING A FLOW FIELD PLATE COATING

(71) Applicant: Robert Bosch GmbH, Stuttgart (DE)

(72) Inventors: Soo Kim, Cambridge, MA (US); Mordechai Kornbluth, Brighton, MA (US); Jonathan Mailoa, Cambridge, MA (US); Lei Cheng, Sunnyvale, CA (US); Georgy Samsonidze, San Francisco, CA (US); Boris Kozinsky, Waban, MA (US); Nathan Craig, Santa Clara, CA (US)

(73) Assignee: Robert Bosch GmbH, Stuttgart (DE)

( * ) Notice: Subject to any disclaimer, the term of this patent is extended or adjusted under 35 U.S.C. 154(b) by 80 days.

(21) Appl. No.: 16/428,113

(22) Filed: May 31, 2019

(65) Prior Publication Data

US 2020/0378004 A1 Dec. 3, 2020

(51) Int. Cl.
| | | |
|---|---|---|
| *H01M 8/00* | (2016.01) | |
| *C23C 16/455* | (2006.01) | |
| *H01M 8/0254* | (2016.01) | |
| *C23C 16/40* | (2006.01) | |
| *C23C 16/34* | (2006.01) | |
| *C23C 18/12* | (2006.01) | |

(52) U.S. Cl.
CPC ........ *C23C 16/45555* (2013.01); *C23C 16/34* (2013.01); *C23C 16/40* (2013.01); *C23C 16/403* (2013.01); *C23C 16/407* (2013.01); *C23C 16/45553* (2013.01); *C23C 18/125* (2013.01); *C23C 18/1216* (2013.01); *H01M 8/0254* (2013.01)

(58) Field of Classification Search
CPC .............................................. C23C 16/45555
See application file for complete search history.

(56) References Cited

U.S. PATENT DOCUMENTS

| | | | |
|---|---|---|---|
| 7,482,083 B2 | 1/2009 | Iqbal et al. | |
| 9,136,545 B2 | 9/2015 | Dadheech et al. | |
| 2002/0071978 A1* | 6/2002 | Bekkedahl .......... | H01M 8/0267 429/446 |
| 2006/0194095 A1 | 8/2006 | Vyas et al. | |
| 2006/0216571 A1* | 9/2006 | Vyas ................... | H01M 8/0228 429/444 |
| 2007/0092780 A1* | 4/2007 | Vyas ................... | H01M 8/0228 429/518 |
| 2008/0076004 A1* | 3/2008 | Rodak .................. | H01M 8/023 429/457 |

(Continued)

OTHER PUBLICATIONS

Ostergaard et al., Oxidation of Ethylene Carbonate on Li Metal Oxide Surfaces, The Journal of Physical Chemistry, Apr. 23, 2018, DOI:1031021/acs.jpcc.8b01713, pp. 10442-10449, Denmark, 8 pages.

(Continued)

*Primary Examiner* — Austin Murata
(74) *Attorney, Agent, or Firm* — Brooks Kushman P.C.

(57) ABSTRACT

A method of applying a coating to a flow field plate of a fuel cell. The method includes applying a solution including a metal-containing precursor and a solvent to at least a portion of a surface of a flow field plate, and evaporating the solvent to form a coating on the at least the portion of the surface of the flow field plate.

11 Claims, 4 Drawing Sheets

(56) References Cited

U.S. PATENT DOCUMENTS

| | | | | |
|---|---|---|---|---|
| 2008/0124587 A1* | 5/2008 | Kisailus | ............. | H01M 8/0228 |
| | | | | 429/518 |
| 2009/0214927 A1* | 8/2009 | Dadheech | ........... | H01M 8/0206 |
| | | | | 429/434 |
| 2012/0094215 A1* | 4/2012 | Satou | ................. | H01M 8/1004 |
| | | | | 429/516 |
| 2014/0272659 A1* | 9/2014 | Lu | .................... | H01M 8/04291 |
| | | | | 429/450 |
| 2016/0056312 A1* | 2/2016 | Palm | .............. | H01L 31/022425 |
| | | | | 136/256 |

OTHER PUBLICATIONS

Odetola et al., Electrodeposition of Functional Coatings on Bipolar Plates for Fuel Cell Applications—A Review, Intech, South Africa, 22 pages.

Norskov et al., Density functional theory in surface chemistry and catalysis, PNAS, Jan. 18, 2011, vol. 108, No. 3, Washington, 7 pages.

Dondoni et al., Asymmetric Organocatalysis: From Infancy to Adolescence, Organocataylsis, Apr. 17, 2008, Italy, 23 pages.

Kinumoto et al., Anticorrosion properties of tin oxide coatings for carbonaceous bipolar plates of proton exchange membrance fuel cells, Journal of Power Sources, Oct. 29, 2013, Japan, 6 pages.

\* cited by examiner

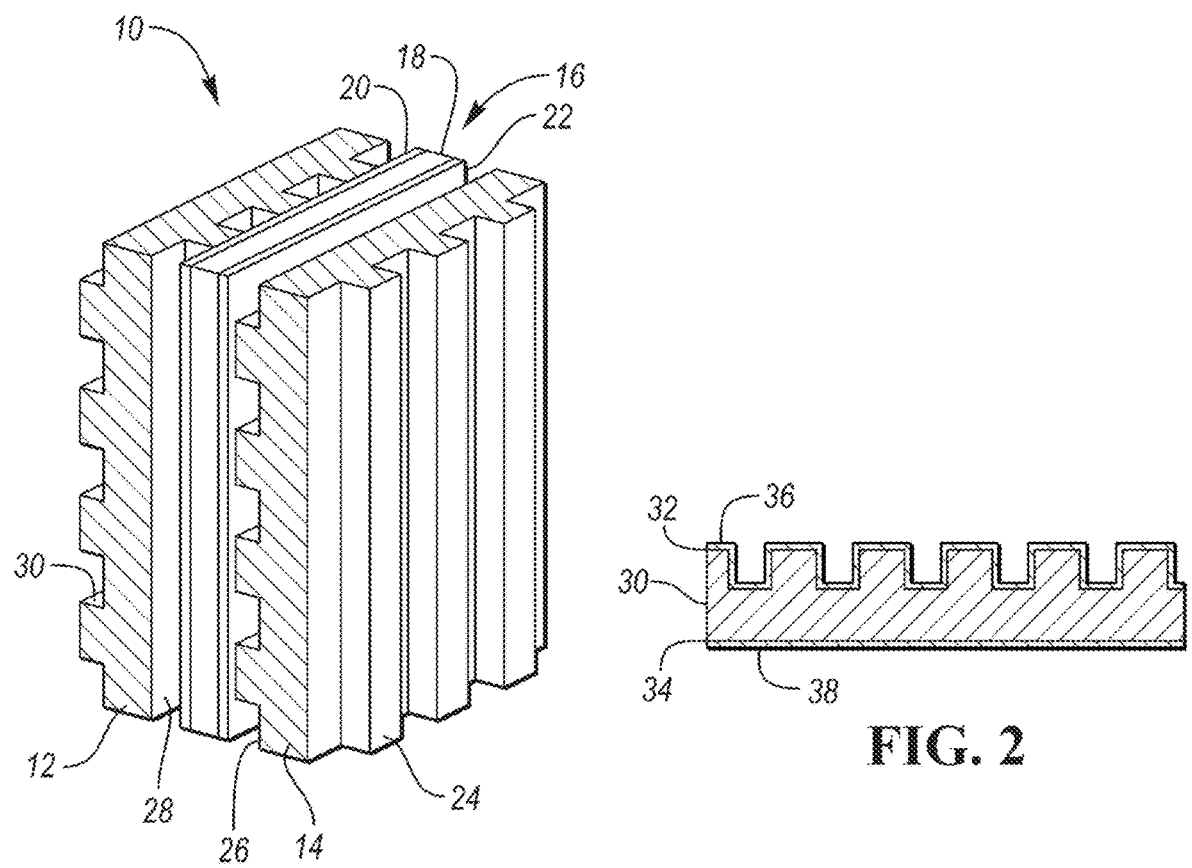
FIG. 1
FIG. 2
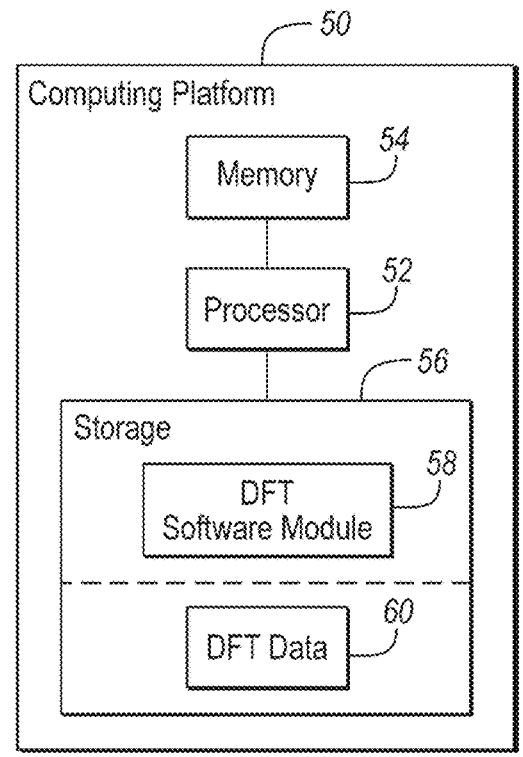
FIG. 3

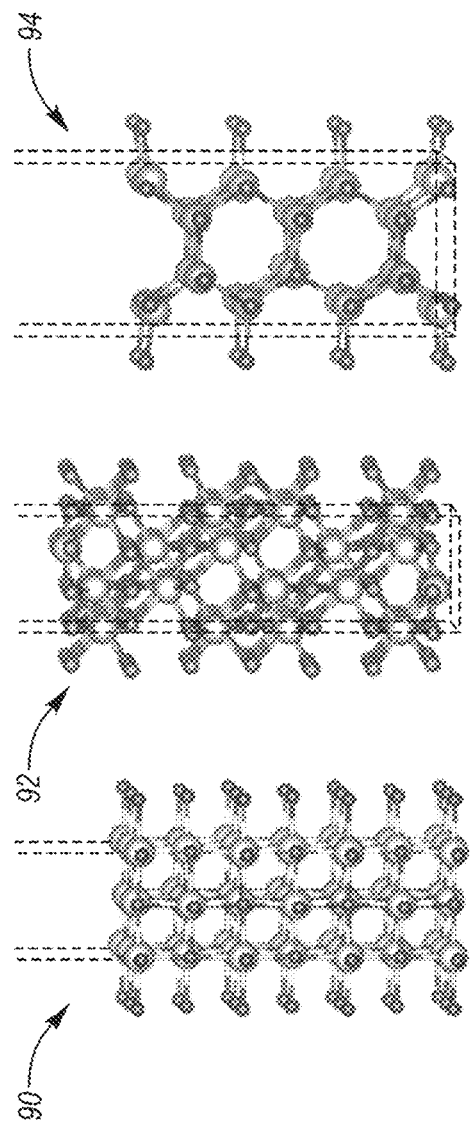
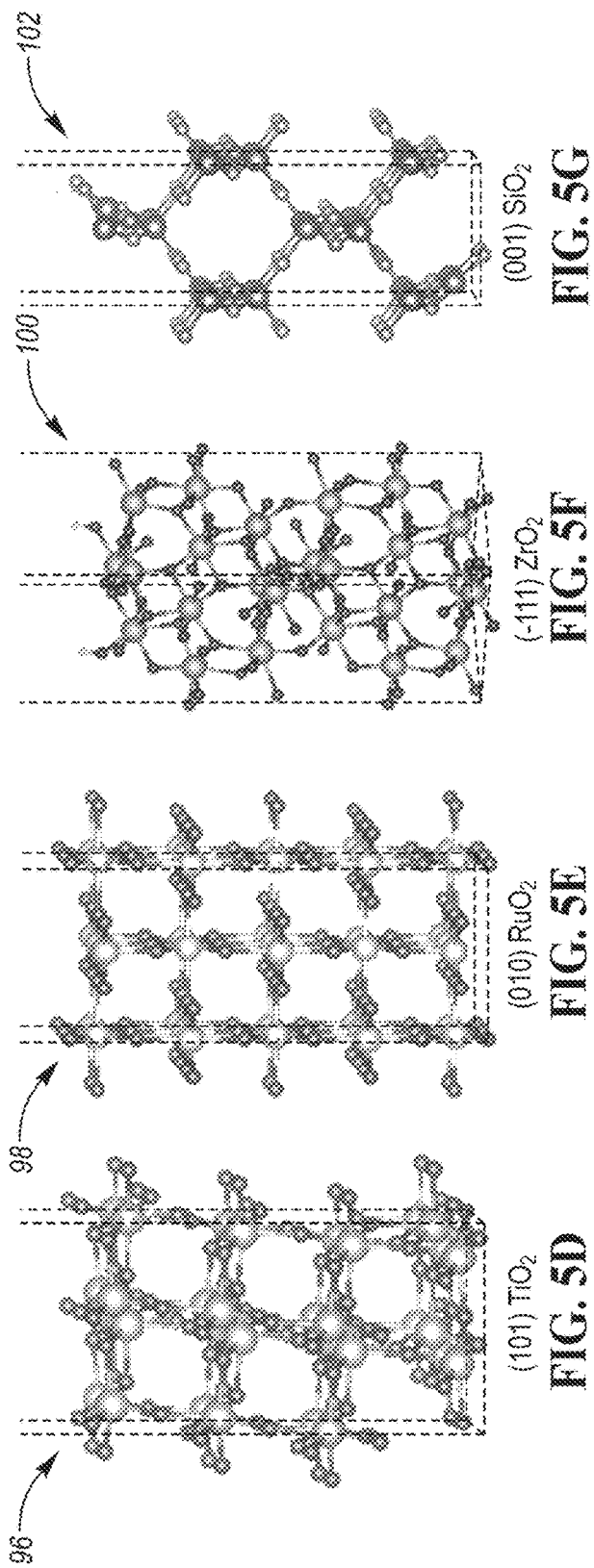

US 11,377,738 B2

METHOD OF APPLYING A FLOW FIELD PLATE COATING

TECHNICAL FIELD

The present disclosure relates to a method of applying a coating to a flow field plate (e.g., bipolar plate) of a fuel cell.

BACKGROUND

Flow field plates (e.g., bipolar plates) are an expensive component of a proton-exchange membrane fuel cell (PEMFC) stack. In many instances, the flow field plates are the second most expensive component, with the catalyst material typically being the most expensive. Stainless steel plates have been utilized as a relatively low-cost material for the flow field plates. However, stainless steel plates may be susceptible to corrosion in the acidic environment during the operation of PEMFCs. While coatings have been proposed to help reduce corrosive behavior, there remains a need for a coating system that adequately protects flow field plates while not degrading functional performance of the PEMFC stack.

SUMMARY

According to one embodiment, a method of applying a coating to a flow field plate of a fuel cell is disclosed. The method includes applying a solution including a metal-containing precursor and a solvent to at least a portion of a surface of a flow field plate. The method further includes evaporating the solvent to form a coating on the at least the portion of the surface of the flow field plate.

According to another embodiment, a method of applying a coating to a flow field plate of a fuel cell is disclosed. The method includes calculating one or more adsorption energies of one or more reactive elements, respectively, on a plurality of coating materials. The method further includes selecting a protective coating material from the plurality of coating materials based on the one or more adsorption energies. The method also includes selecting a deposition method for depositing the protective coating material onto a surface of the flow field plate based on the one or more adsorption energies or an electronic conductivity of each of the plurality of coating materials. The method further includes applying the protective coating material using the deposition method to the surface of the flow field plate.

According to yet another embodiment, a method of applying a coating to a flow field plate of a fuel cell is disclosed. The method includes calculating one or more adsorption energies of one or more reactive elements, respectively, on a plurality of coating materials, selecting a protective coating combination from the plurality of coating materials based on the one or more adsorption energies, and applying the protective coating combination to a surface of the flow field plate.

BRIEF DESCRIPTION OF THE DRAWINGS

FIG. 1 is a schematic, perspective view of fuel cell including anode-side and cathode-side flow field plates and a membrane unit situated therebetween according to one embodiment.

FIG. 2 is a schematic, cross-section view of a flow field plate including first and second protective coatings according to one embodiment.

FIG. 3 is a schematic diagram of a computing platform that may be utilized to implement DFT algorithms and/or methodologies of one or more embodiments.

FIGS. 5a through 5g depict schematic views of DFT slab models of representative binary oxides according to one embodiment.

DETAILED DESCRIPTION

Figure 4:
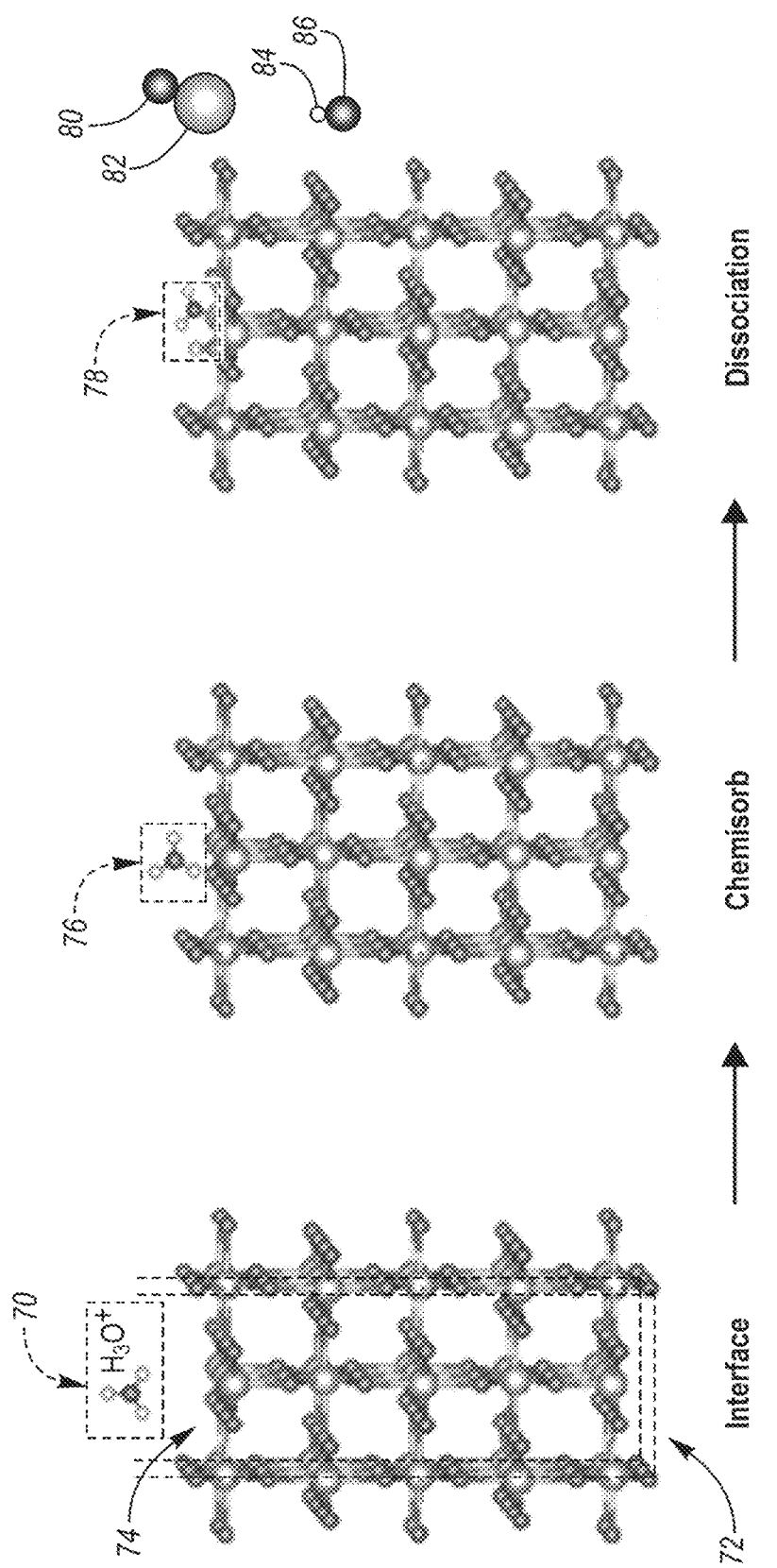
FIG. 4 is a schematic view depicting chemical reactions between an adsorbate molecule and a BPP coating material according to an embodiment.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of" and ratio values are by weight; the term "polymer" includes "oligomer," "copolymer," "terpolymer," and the like; the description of a group or class of materials as suitable or preferred for a given purpose in connection with the invention implies that mixtures of any two or more of the members of the group or class are equally suitable or preferred; molecular weights provided for any polymers refers to number average molecular weight; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

This invention is not limited to the specific embodiments and methods described below, as specific components and/or conditions may, of course, vary. Furthermore, the terminology used herein is used only for the purpose of describing particular embodiments of the present invention and is not intended to be limiting in any way.

As used in the specification and the appended claims, the singular form "a," "an," and "the" comprise plural referents unless the context clearly indicates otherwise. For example, reference to a component in the singular is intended to comprise a plurality of components.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

Coatings have been proposed for reducing the corrosive effects on flow field plates within the acidic environment of a proton-exchange membrane fuel (PEMFC) stack. However, previous proposals have not appreciated how these coatings can behave in a functional manner to extend the usage and lifecycle of flow field plates (e.g., bipolar plates ("BPP")). While trial and error type experimentation and analysis may be performed to study functional coatings, such experimentation and analysis does not provide a comprehensive understanding of the physical descriptors that can predict chemical stability of coatings for BPPs and other bipolar plates. This comprehensive understanding would need to appreciate different surface phenomenon, such as dissolution, catalytic activity, and corrosion.

In one or more embodiments herein, computational methods are utilized to examine the surface phenomenon of different BPP coating materials with chemical present in PEMFCs. In one embodiment, first-principles density functional theory (DFT) computational algorithms and/or methods may be used to select protective coating materials from a number of coating materials. The selected protective coating material may be applied to the surface of the BPP or flow field plate as disclosed herein.

FIG. 1 is a schematic, perspective view of fuel cell 10 including anode-side flow plate 12 and cathode-side flow plate 14. Fuel cell 10 includes membrane unit 16, which includes a proton-conducting polymer membrane 18. The membrane unit 16 further includes first and second diffusion layers 20 and 22 arranged on the sides of polymer membrane 18. Fuel cell 10 has anode-side flow plate 12 and cathode-side flow plate 14. Membrane unit 16 is arranged between anode-side flow plate 12 and cathode-side flow plate 14. Anode-side flow plate 12 includes first surface 24 and opposing second surface 26. Cathode-side flow plate 14 includes first surface 28 and opposing second surface 30. Anode-side flow plate 12 and cathode-side flow plate 14 may be bipolar plates (BPPs).

FIG. 2 is a schematic, cross-section view of flow plate 32 including surfaces 34 and 36. As shown in FIG. 2, each of surfaces 34 and 36 are coated with protective coatings 38 and 40, respectively. Protective coatings 38 and 40 may be conformal coatings, island-type coatings or a combination thereof. In other embodiments, only one of surfaces 34 and 36 are coated with a protective coating. Only a portion of surfaces 34 and/or 36 may be coated with a protective coating. Protective coatings 38 and/or 40 protect flow plate 32 from the acidic environment of a PEMFC. Flow plate 32 may be formed of a metal material, such as stainless steel, aluminum-based alloys, titanium-based alloys or combinations thereof, or graphite. The metal material may be susceptible to degradation in the acidic environment of a PEMFC. Protective coatings 38 and/or 40 may slow down or prevent corrosion of flow plate 32 due to the PEMFC's environment. Flow plate 32 may be a bipolar plate (BPP).

In one embedment, the selection of a BPP coating material is based on the chemical reactivity (e.g., material stability) in an acidic environment of the coating material. A BPP coating material that is chemically inert and does not decompose when in contact with chemicals present during the operation of PEMFCs may slow down or prevent corrosion of BPPs, for instance, stainless steel BPPs. The BPP coating layers would also create a physical barrier between the coating layers and the BPP. The physical barrier may provide the following benefits: (1) reduction of pinhole formation in BPPs; (2) prevention of Fe (or other metal) dissolution from BPPs; and (3) suppression of $Fe_2O_3$ formation. Dissolved metal ions may also cause degradation of a proton exchange membrane in the PEMFC. In some applications, the BPP coating materials may also include an electronically conductive coating material. The electronic conduction would permit electron transfers within the cell device of the PEMFC to aid in the oxygen reduction reaction (ORR).

In one embodiment, first-principles DFT slab model algorithms and/or methodologies are used to model actual chemical interfaces between BPP coatings and chemicals present in a PEMFC environment. These calculations can be used to design and select materials for BPP coatings. In one embodiment, the chemical present and examined are the chemical molecules of $H_3O^+$, HF, $OH^-$, and/or $SO_3^-$, which represent chemicals that may degrade or corrode BPPs, and are commonly present in a PEMFC environment. As described below, the chemical molecules of $H_3O^+$, HF, $OH^-$, and/or $SO_3^-$ are represented using a single-atom adsorption of H, F, O, and S. The chemical interface examined may include an adsorbate molecule and a BPP coating. In this context, the adsorbate molecules may be $H_3O^+$, HF, $OH^-$, and/or $SO_3^-$.

The DFT slab model algorithms and/or methodologies of one or more embodiments are implemented using a computing platform, such as the computing platform 50 illustrated in FIG. 3. The computing platform 50 may include a processor 52, memory 54, and non-volatile storage 56. The processor 52 may include one or more devices selected from high-performance computing (HPC) systems including high-performance cores, microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on computer-executable instructions residing in memory 54. The memory 54 may include a single memory device or a number of memory devices including, but not limited to, random access memory (RAM), volatile memory, non-volatile memory, static random access memory (SRAM), dynamic random access memory (DRAM), flash memory, cache memory, or any other device capable of storing information. The non-volatile storage 56 may include one or more persistent data storage devices such as a hard drive, optical drive, tape drive, non-volatile solid state device, cloud storage or any other device capable of persistently storing information.

Processor 52 may be configured to read into memory 54 and execute computer-executable instructions residing in DFT software module 58 of the non-volatile storage 56 and embodying DFT slab model algorithms and/or methodologies of one or more embodiments. Software module 58 may include operating systems and applications. Software module 58 may be compiled or interpreted from computer programs created using a variety of programming languages and/or technologies, including, without limitation, and either alone or in combination, Java, C, C++, C#, Objective C, Fortran, Pascal, Java Script, Python, Perl, and PL/SQL.

Upon execution by the processor 52, the computer-executable instructions of the DFT software module 58 may cause the computing platform 50 to implement one or more of the DFT algorithms and/or methodologies disclosed herein. Non-volatile storage 56 may also include DFT data 60 supporting the functions, features, calculations, and processes of the one or more embodiments described herein.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

As generated by DFT software module 58, FIG. 4 is a schematic view depicting chemical reactions between an adsorbate molecule and a BPP coating according to an embodiment. As shown in FIG. 4, adsorbate molecule 70 of $H_3O^+$ and oxide coating candidate 72 of $RuO_2$ are shown. Adsorbate molecule 70 may be any molecule that is commonly present in a PEMFC. Non-limiting examples include $H_3O^+$, HF, $OH^-$, and/or $SO_3^-$. In one or more embodiments, oxide coating 72 at least partially coats or covers a BPP surface. In certain embodiments, a different type of coating, such as a nitride coating, may at least partially coat and cover a BPP surface. As shown in FIG. 4, adsorbate molecule 70 interfaces with oxide coating 72 at interface 74. At interface 74, additional molecules and impurities may be present, such as $H_2O$ (either moisture or gaseous form), hydrogen, oxygen, dissolved metal, acids and/or bases.

A chemisorption reaction occurs at interface 74 between adsorbate molecule 70 and oxide coating 72. The chemisorption reaction is depicted at arrow 76. The chemisorption reaction is followed by a dissociation reaction, as depicted by arrow 78. During the dissociation reaction, anion 80 from adsorbate molecule 70 (the O in $H_3O^+$ as shown in FIG. 4) dissociates on surface metal atom 82 of oxide coating 72 (an Ru atom of $RuO_2$ as shown in FIG. 4). As a further part of this dissociation reaction, cation 84 from adsorbate molecule (an H in $H_3O^+$ as shown in FIG. 4) dissociates on surface oxygen atom 86 of oxide coating 72 (an O of $RuO_2$ as shown in FIG. 4). In one embodiment, a single-atom adsorption tendency of (1) an anion on a surface metal atom and (2) a cation on a surface oxygen atom is calculated using a computational algorithm (e.g., a DFT algorithm). This calculation captures both the underlying chemical reaction and the thermodynamic energetics between an adsorbate molecule and a coating substrate.

While FIG. 4 shows the chemical reactivity of $H_3O^+$ in a PEMFC environment using single-atom adsorption calculations via DFT methods, these methods can also be used to measure the chemical reactivities for other molecules found in the PEMFC environment, such as HF, $OH^-$, and $SO_3^-$. In different embodiments, an accelerated approach by using a single atom, such as H, F, O, S, etc. to represent H for $H_3O^+$, F for HF, S for $SO_3^-$, and O for $OH^-$, etc. on twenty-three (23) different binary oxides and nitrides ($MgO$, $Al_2O_3$, $TiO_2$, $ZrO_2$, $ZnO$, $SnO_2$, $Cr_2O_3$, $MoO_3$, $MoO_2$, NbO, TiO, TiN, ZrN, NbN, VN, MoN, $CrO_2$, $RuO_2$, CuO, NiO, $MnO_2$, $SiO_2$, and $Fe_2O_3$) may be used. In other embodiments, the oxides and nitrides selected are not binary and may include additional metal atoms, such as ternary oxides or nitrides. For each system, a surface facet for each oxide and nitride is selected. In one embodiment, the surface facet may be an energetically-stable surface facet. In another embodiment, the most energetically-stable surface facet according to experimentation and/or computations is selected as follows: 001) MgO, (001) $Al_2O_3$, (101) $TiO_2$, (-111) $ZrO_2$, (110) ZnO, (110) $SnO_2$, (001) $Cr_2O_3$, (010) $MoO_3$, (110) $MoO_2$, (001) NbO, (001) TiO, (001) TiN, (001) ZrN, (001) NbN, (001) VN, (001) MoN, (110) $CrO_2$, (110) $RuO_2$, (111) CuO, (100) NiO, (110) $MnO_2$, (001) $SiO_2$, and (001) $Fe_2O_3$.

Metal oxides and nitrides may be represented by DFT slab models. FIGS. 5a through 5g depict schematic views of DFT slab models of representative binary oxides according to one embodiment. FIG. 5a depicts slab model 90 of (001) MgO. FIG. 5b depicts slab model 92 of (001) $Al_2O_3$. FIG. 5c depicts slab model 94 of (110) ZnO. FIG. 5d depicts slab model 96 of (101) $TiO_2$. FIG. 5e depicts slab model 98 of (110) $RuO_2$. FIG. 5f depicts slab model 100 of (-111) $ZrO_2$. FIG. 5g depicts slab model 102 of (001) $SiO_2$.

Table 1 below reports DFT single-atom adsorption energies of H, F, O, and S for (001) MgO, (001) $Al_2O_3$, (101) $TiO_2$, (-111) $ZrO_2$, (110) ZnO, (110) $SnO_2$, (001) $Cr_2O_3$, (010) $MoO_3$, (110) $MoO_2$, (001) NbO, (001) TiO, (001) TiN, (001) ZrN, (001) NbN, (001) VN, (001) MoN, (110) $CrO_2$, (110) $RuO_2$, (111) CuO, (100) NiO, (110) $MnO_2$, (001) $SiO_2$, and (001) $Fe_2O_3$ slab models. The DFT single-atom adsorption energies of H, F, O, and S are found in the columns named $\Delta E_{H,ads}$, $\Delta E_{F,ads}$, $\Delta E_{O,ads}$, and $\Delta E_{S,ads}$, respectively, of Table 1. The units for $\Delta E_{H,ads}$, $\Delta E_{F,ads}$, $\Delta E_{O,ads}$, and $\Delta E_{S,ads}$ are eV. Table 1 also includes the surface oxygen or nitrogen DFT vacancy formation energy calculation results as $\Delta E_{O(N),vac}$ in eV. The $\Delta E_{O(N),vac}$ value indicates the energy penalty to remove a surface anion from a coating material. In many circumstances, a decomposition reaction may be initiated by the surface dissolution step.

Accordingly, having a high oxygen or nitrogen vacancy formation energy typically leads to a higher coating stability. Table 1 also includes an approximate range of experimental conductivities (Exp. σ) in S/m.

Table 1 is included below.

| Surface | $\Delta E_{H, ads}$ | $\Delta E_{F, ads}$ | $\Delta E_{O, ads}$ | $\Delta E_{S, ads}$ | $\Delta E_{O(N), vac}$ | Ex. σ |
|---|---|---|---|---|---|---|
| (001) MgO | 1.965 | 0.460 | 2.743 | 1.147 | 6.585 | $\sim 10^{-8}$ |
| (001) Al$_2$O$_3$ | 1.570 | −2.739 | 1.194 | 1.922 | 6.073 | $\sim 10^{-13}$ |
| (101) TiO$_2$ | 0.039 | −1.410 | 1.758 | 2.262 | 5.010 | $\sim 10^{-10}$ |
| (−111) ZrO$_2$ | 0.961 | −1.885 | 0.091 | 0.481 | 6.493 | $\sim 10^{-7}$ |
| (110) ZnO | 0.071 | −1.583 | 1.606 | 0.459 | 3.165 | $\sim 10^{-5}$ |
| (110) SnO$_2$ | −1.364 | −1.791 | 2.174 | 2.434 | 2.671 | $\sim 10^{-5}$ |
| (001) Cr$_2$O$_3$ | 0.595 | −4.279 | −3.237 | −0.969 | 5.415 | $\sim 10^{-4}$ |
| (010) MoO$_3$ | −1.526 | −1.984 | 0.208 | 1.775 | 0.260 | $\sim 10^{-3}$ |
| (110) MoO$_2$ | 0.096 | −4.401 | −3.685 | −1.266 | 5.011 | $\sim 10^{2}$ |
| (001) NbO | 1.172 | −5.210 | −4.378 | −2.236 | 5.770 | $\sim 10^{6}$ |
| (001) TiO | 0.763 | −2.155 | −4.633 | −5.165 | 4.899 | $\sim 10^{4}$ |
| (001) TiN | 0.400 | −4.487 | −3.197 | −0.822 | 3.013 | $\sim 10^{7}$ |
| (001) ZrN | 0.588 | −5.089 | −3.495 | −1.385 | 3.323 | $\sim 10^{7}$ |
| (001) NbN | 0.321 | −4.478 | −4.075 | −1.558 | 2.031 | $\sim 10^{6}$ |
| (001) VN | 0.106 | −3.704 | −3.307 | −0.786 | 1.659 | $\sim 10^{7}$ |
| (001) MoN | −0.956 | −4.245 | −4.048 | −2.582 | 1.507 | $\sim 10^{6}$ |
| (110) CrO$_2$ | −1.140 | −2.758 | −1.313 | 0.947 | 2.422 | $\sim 10^{4}$ |
| (110) RuO$_2$ | −0.997 | −3.123 | −1.363 | 0.179 | 2.989 | $\sim 10^{6}$ |
| (111) CuO | −0.954 | −2.703 | 0.384 | 2.074 | 2.592 | $\sim 10^{-8}$ |
| (100) NiO | −0.254 | −3.229 | −0.615 | 0.247 | 2.577 | $\sim 10^{-13}$ |
| (110) MnO$_2$ | −1.539 | −2.200 | −0.218 | 1.430 | 1.793 | $\sim 10^{-9}$ |
| (001) SiO$_2$ | −0.175 | −3.306 | −0.616 | −0.009 | 3.135 | $\sim 10^{-12}$ |
| (001) Fe$_2$O$_3$ | −0.009 | −4.013 | −2.053 | −0.713 | 2.938 | $\sim 10^{-5}$ |

In one embodiment, a positive DFT adsorption energy indicates a high stability of the coating material (i.e., it costs energy for a reaction to occur), while a negative DFT adsorption energy indicates that the coating material and the adsorbate would react (e.g., a spontaneous reaction). As a control, certain metal oxides that are known to react with acid were included in the group of metal oxides examined. For example, according to Table 1, (001) SiO$_2$ and (110) MnO$_2$ have all negative adsorption energies. These calculations align with the known experimental data demonstrating that SiO$_2$ and MnO$_2$ react with HF, H$_2$SO$_4$ and other acids. In one embodiment, the calculation results are used to categorize the twenty (23) oxides and nitrides into four categories: (1) protective, but insulating; (2) less protective than (1) and moderately conducting; (3) not very protective, but conducting; and (4) not an ideal BPP coating candidate. In one embodiment, each of the oxides and/or nitrides in category (1) are more protective than each of the oxides and/or nitrides in category (2), and each of the oxides and/or nitrides in category (1) are less conductive than each of the oxides and/or nitrides in category (2).

The protective characteristic of each of the oxides and/or nitrides may be measured by corrosion current. In one embodiment, the corrosion current of category (1) molecules may be less than or equal to any one of the following values or within a range of any two of the following values: 0.8, 0.9, 1.0, 1.1, 1.2 and 1.5 µAcm$^{-2}$ at 80° C. at pH of 1 to 4 in the presence of about 0.1 ppm of HF in solution. In one embodiment, the corrosion current of category (2) molecules may be less than or equal to any one of the following values or within a range of any two of the following values: 2.0, 5.0, 6.0, 7.0, 8.0, 9.0, 10.0, 11.0 and 12.0 µAcm$^{-2}$ at 80° C. at pH of 1 to 4 in the presence of about 0.1 ppm of HF in solution. In one embodiment, the electrical conductivity of category (1) molecules may be greater than or equal to any one of the following values or within a range of any two of the following values: 100, 10$^3$, 10$^4$ and 10$^5$ S cm$^{-1}$. In one embodiment, the electrical conductivity of category (2) molecules may greater than or equal to any one of the following values or within a range of any two of the following values: 0.1, 1, 10 and 100 S cm$^{-1}$. The interfacial contact resistance between an SS BPP and a given category (1) or (2) coating molecule may be less than or equal to 0.01, 0.5 and 0.1 Ohm cm$^2$.

In one embodiment, based on the data from Table 1, the following oxides fall into category (1) (protective, but insulating): (001) MgO, (001) Al$_2$O$_3$, (101) TiO$_2$, and (−111) ZrO$_2$. In one embodiment, the following oxides fall into category (2) (less protective than (1) and moderately conducing): (110) ZnO, (110) SnO$_2$, (001) Cr$_2$O$_3$, (010) MoO$_3$, and (110) MoO$_2$. In one embodiment, the following oxides and nitrides fall into category (3) (relatively not very protective): (001) NbO, (001) TiO, (001) TiN, (001) ZrN, (001) NbN, and (001) VN. In one embodiment, the following oxides and nitrides fall into category (4) (not an ideal BPP coating candidate): (001) MoN, (110) CrO$_2$, (110) RuO$_2$, (111) CuO, (100) NiO, (110) MnO$_2$, (001) SiO$_2$, and (001) Fe$_2$O$_3$.

In one embodiment, an oxide or nitride having four (4) positive adsorption energies is considered a category (1) (very protective) oxide or nitride, and they are usually insulating. An oxide or nitride having three (3) positive adsorption energies may be considered a category (1) (very protective) oxide or nitride, and they are usually insulating, as well. An oxide or nitride having two (2) positive adsorption energies may be considered a category (2) (less protective than (1)) oxide or nitride, where they are found to be moderately conducting. An oxide or nitride having one (1) positive adsorption energies may be considered a category (3) (relatively not very protective, but conducting) oxide or nitride. An oxide or nitride having zero (1) positive adsorption energies may be considered a category (4) (not an ideal BPP coating candidate) oxide or nitride. In one embodiment, the categorizations identified above may be changed based on other data about the oxide or nitride. For example, (111) CuO has two (2) positive adsorption energies (stability against OH$^-$ and SO$^{3-}$, but $\Delta E_{OH,ads}$ is close to zero) and two (2) negative adsorption energies (reacting with H$_3$O+ and HF), and therefore it is considered within category (4).

In another embodiment, a first DFT single-atom adsorption energy ($\Delta E_{x,ads}$) is correlated to a second DFT single-atom adsorption energy ($\Delta E_{y,ads}$) or a surface oxygen or nitrogen DFT vacancy formation energy $\Delta E_{O(N),vac}$). FIGS. 6a through 6d depict graphs of correlations between a first DFT single-atom adsorption energy ($\Delta E_{x,ads}$) and a second DFT single-atom adsorption energy ($\Delta E_{y,ads}$) or a surface oxygen or nitrogen DFT vacancy formation energy ($\Delta E_{O(N),vac}$) according to one embodiment. Graph 110 of FIG. 6a graphs $\Delta E_{H,ads}$ in eV as a function of $\Delta E_{O(N),vac}$ in eV for the twenty-three (23) oxides and nitrides of Table 1. Graph 112 of FIG. 6b graphs $\Delta E_{F,ads}$ in eV as a function of $\Delta E_{ads}$ in eV for the twenty-three (23) oxides and nitrides of Table 1. Graph 114 of FIG. 6c graphs $\Delta E_{S,ads}$ in eV as a function of $\Delta E_{O,ads}$ in eV for the twenty-three (23) oxides and nitrides of Table 1. Graph 116 of FIG. 6d graphs $\Delta E_{F,ads}$ in eV as a function of $\Delta E_{H,ads}$ in eV for the twenty-three (23) oxides and nitrides of Table 1.

Figure 6A:
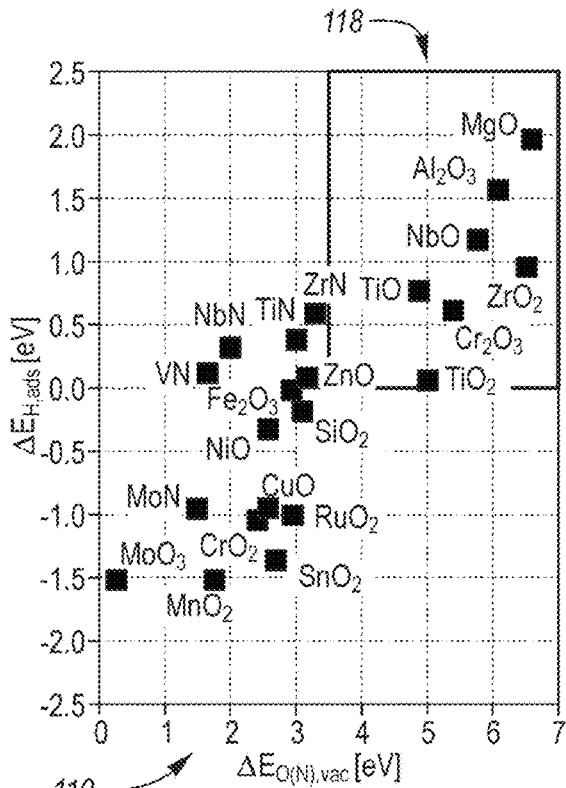
FIGS. 6a through 6d depict graphs of correlations between a first DFT single-atom adsorption energy and a second DFT single-atom adsorption energy or a surface oxygen or nitrogen DFT vacancy formation energy according to one embodiment.
Figure 6B:
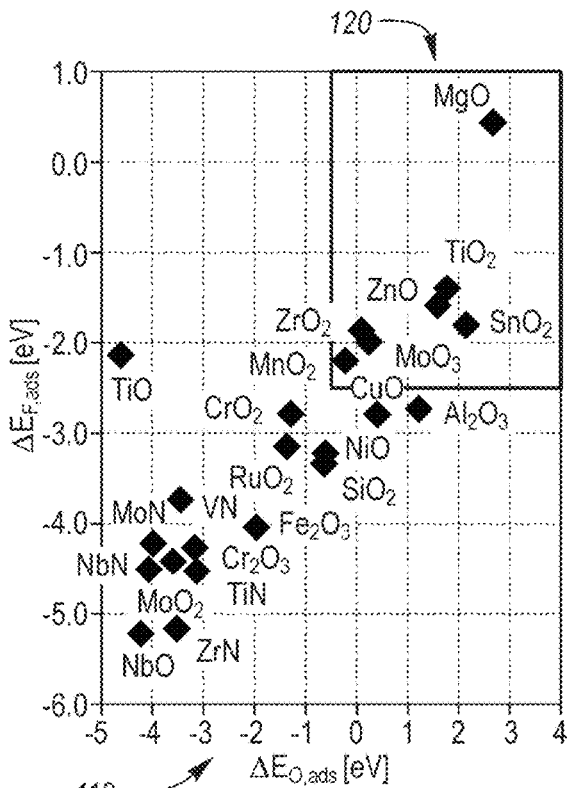
Figure 6C:
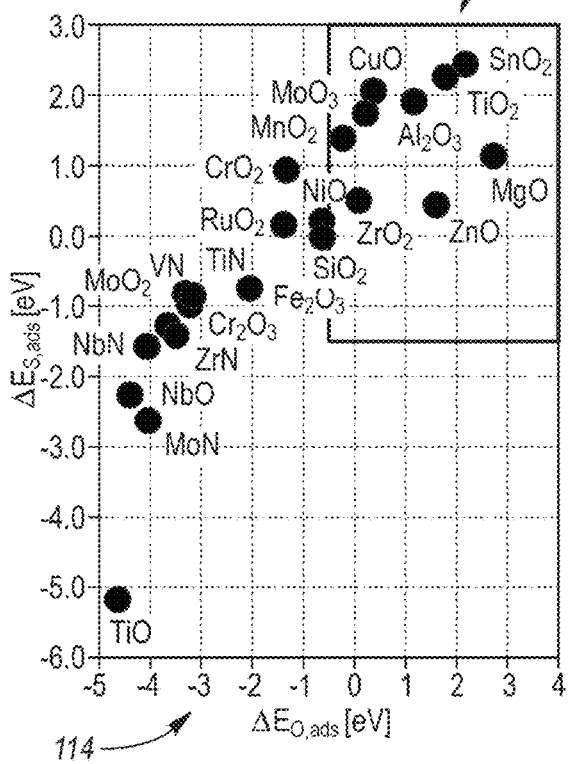
Figure 6D:
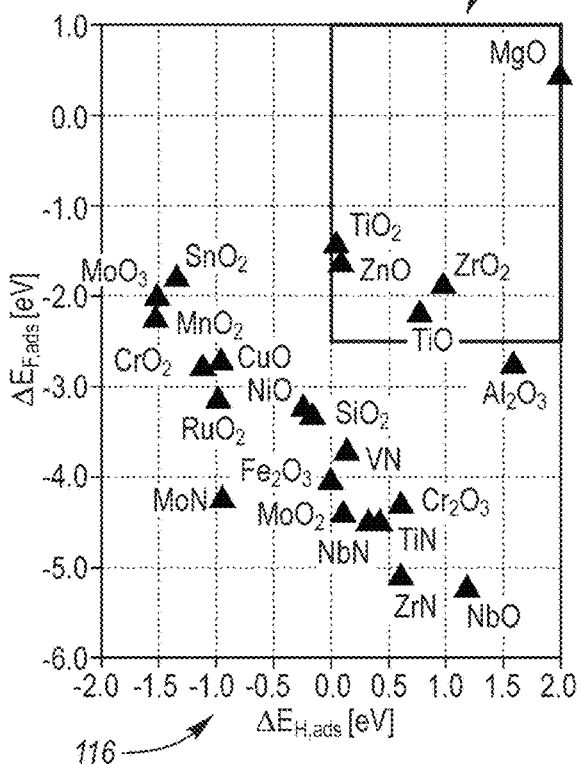

In one embodiment, it can be determined that the oxide or nitride should be utilized if the material located in the upper-right quadrant of one (1), two (2), three (3) or four (4) of graphs 110, 112, 114, and 116. As shown in FIG. 6a, graph 110 includes upper-right quadrant 118. As shown in FIG. 6b, graph 112 includes upper-right quadrant 120. As shown in FIG. 6c, graph 114 includes upper-right quadrant 122. As shown in FIG. 6d, graph 114 includes upper-right quadrant 124. In graph 110, the upper-right quadrant may be identified as a $\Delta E_{H,ads}$ in a range of greater than or equal to 0.0 eV ±1, 2, 5 or 10% and a $\Delta E_{O(N),vac}$ in a range of greater than or equal to 3.5 eV ±1, 2, 5 or 10%. In graph 112, the upper-right quadrant may be identified as a $\Delta E_{F,ads}$ in a range of greater than or equal to −2.5 eV ±1, 2, 5 or 10% and a $\Delta E_{O,ads}$ in a range of greater than or equal to −0.5 eV ±1, 2, 5 or 10%. In graph 114, the upper-right quadrant may be identified as a $\Delta E_{S,ads}$ in a range of greater than or equal to −1.5 eV ±1, 2, 5 or 10% and a $\Delta E_{O,ads}$ in a range of greater than or equal to −0.5 eV ±1, 2, 5 or 10%. In graph 116, the upper-right quadrant may be identified as a $\Delta E_{F,ads}$ in a range of greater than or equal to −2.5 eV ±1, 2, 5 or 10% and a $\Delta E_{H,ads}$ in a range of greater than or equal to 0.0 eV ±1, 2, 5 or 10%.

The protective coating material may be a ternary oxide of $ABO_x$ form, where the A is a metal from a category (1) metal oxide and B is a metal from a category (2) metal oxide. The composition ratio between A and B may be different (e.g., $A_{0.1}B_{0.9}O_x$, $A_{0.2}B_{0.8}O_x$, $A_{0.3}B_{0.7}O_x$, $A_{0.8}B_{0.2}O_x$, $A_{0.9}B_{0.1}O_x$, etc.) or the same. The $ABO_x$ may be applied to a flow plate surface using a solution-based approach. The protective coating may be a composite of a category (1) materials and a category (2) material. In another embodiment, the protective coating may be a composite of one material selected from a category (1) or category (2) material and one material selected from a category (3) material.

In one or more embodiments, the electronic conductivity of the oxide or nitride may be considered to optimize the coating material. A material having an experimental electronic conductivity ($\sigma$) of any of the following or within a range of any two of the following values: $10^{-14}$, $10^{-12}$, $10^{-10}$ and $10^{-8}$ S/cm may be considered insulating. A material that has an experimental electronic conductivity ($\sigma$) of any one of the following or within a range of any two of the following values: $10^{-8}$, $10^{-5}$, $10^{-2}$, $10^{1}$ and $10^{3}$ S/cm may be considered semi-conductive. A material having an electronic conductivity ($\sigma$) greater than any one of the following values: $10^3$, $10^4$ and $10^5$ S/cm may be considered conductors. If an oxide or nitride material is considered insulating, then a relatively thin nanoscale coating layer may be applied (e.g., applied using an atomic layer deposition technique), which is configured to enable electron transfer in a short-length scale. The thickness of the relatively thin nanoscale coating layer may be any one of the following or within a range of any two of the following values: 1, 5, 10, 25, 50, 75 and 100 nm. If the oxide or nitride material has an electronic conductivity greater than the insulating range, then a relatively thicker coating layer may be applied (e.g., applied using a metal deposition process), which may enhance the stability and protection of the coating layer. The thickness of the relatively thicker coating layer may be any one of the following or within a range of any two of the following values: 50 nm, 100 nm, 500 nm, 1 μm, 10 μm and 100 μm.

The protective coating material, e.g., a metal oxide or nitride, may be applied to a surface of a flow field plate using a variety of different processes. Non-limiting examples of such processes include (1) metal deposition, (2) atomic layer deposition (ALD) and/or (3) solution-based deposition. In one embodiment, a metal electro-deposition process may be used to deposit a protective coating material on a flow field plate surface. In a first step, a thin-film metal or intermetallic film material on the surface. In a second step, the thin-film metal or intermetallic material is heat treated at a high temperature (e.g., in the range of 100 to 2,000° C.) to form a metal oxide on the surface. Non-limiting benefits of this type of process is scalability and relatively low impurities. Considerations in using this type of process are adhesion and contact angles depending on the type of deposition technique and selected precursors.

Another method that may be utilized to apply a protective coating is an atomic layer deposition (ALD) process. This process may be based on a chemical vapor deposition (CVD) process. A CVD process may be used to create a highly uniform and conformal coating configuration. In another embodiment, other types of a physical vapor deposition (PVD) process or sputtering techniques may be utilized.

Yet another process is a solution-based approach. Metal containing precursors, such as $M(NO_3)_x$ and $MCl_x$ may be dissolved into a solvent, such as deionized $H_2O$ and/or non-aqueous solvents (e.g., ethanol, acetone, isopropyl alcohol, etc.) to form a metal containing precursor solution. The metal containing precursor solution may be applied to a flow field plate (e.g., BPP). This step may be followed by evaporating, drying and/or heat treatment steps. Non-limiting benefits of this type of process is scalability and versatility. The resulting coating may less conformal (e.g., island-type coatings).

In one embodiment, category (1) protective coating materials may be applied using an ALD process or solution-based approach. The ALD process results in a nanoscale coating. The thickness of the nanoscale coating may be any one of the following or within a range of any two of the following values: 1, 5, 10, 25, 50, 75 and 100 nm. The solution-based approach may result in an island-type coating of the protective coating material. In this embodiment, protective coating materials that are oxides may be undoped and/or partially doped with nitrogen or fluorine, as well as any other anion from the periodic table, including S, C, Cl, P, etc, to further enhance electronic conductivity of the resulting protective coating. In another embodiment, cation and/or anion vacancy may help increase conductivity of the resulting protective coating material.

In another embodiment, category (2) protective coatings may be applied using a metal deposition process to form a protective coating. The thickness of the protective coating may be any one of the following or within a range of any two of the following values: 50 nm, 100 nm, 500 nm, 1 µm, 10 µm and 100 µm.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A method of applying a protective coating to a flow field plate of a fuel cell, the method comprising:
    applying a solution including a metal-containing precursor and a solvent to at least a first portion of a surface of the flow field plate;
    evaporating the solvent to form the protective coating on the at least the portion of the surface of the flow field plate, the protective coating is a combination of a first metal oxide or nitride and a second metal oxide or nitride, the first metal oxide or nitride has a metal A of Mg, and the second metal oxide or nitride has a metal B of Cr;
    applying the solution including the metal-containing precursor and the solvent to at least a second portion of a second surface of the flow field plate; and
    evaporating the solvent to form a second protective coating including niobium monoxide (NbO) on at least the portion of the second surface of the flow field plate.

2. The method of claim 1, wherein the solvent is water, ethanol, acetone, isopropyl alcohol or a combination thereof.

3. A method of applying a protective coating material to a flow field plate of a fuel cell, the method comprising:
    applying a solution including a metal-containing precursor and a solvent to at least a portion of the flow field plate; and
    evaporating the solvent to form the protective coating material on the at least the portion of a surface of the flow field plate to form island-type structures of the protective coating material on the surface of the flow field plate, the protective coating material is a combination of MgO and niobium oxide (NbO) or TiO, the metal-containing precursor including (a) $Mg(NO_3)_2$ or $MgCl_2$ and (b) $Nb(NO_3)_2$ and $NbCl_2$ or (c) $Ti(NO_3)_2$ and $TiCl_2$.

4. The method of claim 3, wherein the combination of the protective coating material is MgO and niobium oxide (NbO).

5. The method of claim 3, wherein the combination of the protective coating material is MgO and TiO.

6. The method of claim 3, wherein the metal-containing precursor includes (a) $Mg(NO_3)_2$ and (b) $Nb(NO_3)_2$ and $NbCl_2$ or (c) $Ti(NO_3)_2$ and $TiCl_2$.

7. A method of applying a protective coating material to a flow field plate of a fuel cell, the method comprising:
    applying a solution including a metal-containing precursor and a solvent to at least a portion of the flow field plate; and
    evaporating the solvent to form the protective coating material on the at least the portion of a surface of the flow field plate to form island-type structures of the protective coating material on the surface of the flow field plate, the protective coating material is a ternary oxide having a metal A and a metal B and a composition ratio between the metal A and the metal B is different or the same, the metal A is Mg, and the metal B is Zn, Sn, Cr or Mo.

8. The method of claim 7, wherein the metal A is Mg and the metal B is Sn.

9. The method of claim 7, wherein the metal A is Mg and the metal B is Cr.

10. The method of claim 7, wherein the metal A is Mg and the metal B is Zn.

11. The method of claim 7, wherein the metal B is Zn, Sn or Cr.

* * * * *